(12) United States Patent
Too et al.

(10) Patent No.: US 8,378,458 B2
(45) Date of Patent: Feb. 19, 2013

(54) SEMICONDUCTOR CHIP WITH A ROUNDED CORNER

(75) Inventors: Seah S. Too, San Jose, CA (US); Edward Alcid, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 156 days.

(21) Appl. No.: 12/728,423

(22) Filed: Mar. 22, 2010

(65) Prior Publication Data

US 2011/0227201 A1    Sep. 22, 2011

(51) Int. Cl.
*H01L 21/50* (2006.01)

(52) U.S. Cl. ........ 257/620; 257/618; 257/622; 438/460; 438/462; 438/463

(58) Field of Classification Search ........... 257/618, 257/620; 438/33, 68, 113, 460, 462
See application file for complete search history.

(56) References Cited

U.S. PATENT DOCUMENTS

| | | | | |
|---|---|---|---|---|
| 6,455,920 B2* | 9/2002 | Fukasawa et al. | | 257/620 |
| 6,638,691 B2* | 10/2003 | Kang et al. | | 430/313 |
| 7,052,975 B2* | 5/2006 | Koizumi | | 438/460 |
| 7,214,568 B2* | 5/2007 | Brennan et al. | | 438/113 |
| 7,301,222 B1* | 11/2007 | Patwardhan et al. | | 257/620 |
| 7,638,858 B2* | 12/2009 | Kurosawa et al. | | 257/622 |
| 7,687,919 B2* | 3/2010 | Park | | 257/777 |
| 7,776,720 B2* | 8/2010 | Boyle et al. | | 438/463 |
| 2003/0038343 A1* | 2/2003 | Hasegawa | | 257/620 |
| 2004/0043614 A1* | 3/2004 | Koizumi | | 438/689 |
| 2005/0029628 A1* | 2/2005 | Kurosawa | | 257/618 |
| 2005/0056871 A1* | 3/2005 | Taar et al. | | 257/222 |
| 2007/0108621 A1* | 5/2007 | Park | | 257/777 |
| 2007/0187802 A1* | 8/2007 | Kurosawa et al. | | 257/618 |
| 2008/0012095 A1* | 1/2008 | Lee et al. | | 257/618 |
| 2008/0012096 A1* | 1/2008 | Sin et al. | | 257/620 |
| 2008/0150087 A1* | 6/2008 | Farooq et al. | | 257/620 |
| 2009/0057838 A1* | 3/2009 | Arita et al. | | 257/618 |
| 2009/0098712 A1* | 4/2009 | Taguchi et al. | | 438/462 |
| 2009/0152683 A1* | 6/2009 | Nguyen et al. | | 257/620 |
| 2009/0166810 A1* | 7/2009 | Stillman et al. | | 257/620 |
| 2009/0302427 A1* | 12/2009 | Su et al. | | 257/620 |
| 2010/0019354 A1* | 1/2010 | Farooq et al. | | 257/620 |
| 2011/0031591 A1* | 2/2011 | Min et al. | | 257/618 |
| 2011/0147895 A1* | 6/2011 | Bai et al. | | 257/618 |

OTHER PUBLICATIONS

DISCO Corporation; *Laser Application-7000 Series*; www.discousa.com/eg/products/catalog/pdf/dfl7000.pdf; Dec. 2, 2009; pp. 1-8.

* cited by examiner

*Primary Examiner* — Matthew W Such
*Assistant Examiner* — William Harriston
(74) *Attorney, Agent, or Firm* — Timothy M. Honeycutt

(57) ABSTRACT

Various semiconductor chips and methods of making the same are disclosed. In one aspect, a method of manufacturing is provided that includes providing a semiconductor wafer that has plural semiconductor chips. Each of the plural semiconductor chips includes a first principal side and a second and opposite principal side. Material is removed from the semiconductor wafer to define at least one rounded corner of the first principal side of at least one of the plural semiconductor chips.

12 Claims, 5 Drawing Sheets

SEMICONDUCTOR CHIP WITH A ROUNDED CORNER

BACKGROUND OF THE INVENTION

1. Field of the Invention

This invention relates generally to semiconductor processing, and more particularly to semiconductor chips and methods of shaping the same.

2. Description of the Related Art

Flip-chip techniques are frequently used to mount a semiconductor chip or die to a substrate of one sort or another, such as a package substrate or other type of circuit board. In a typical conventional process, a semiconductor chip is singulated from a wafer as a rectangular structure that has four orthogonal corners. Thereafter plural solder joints are formed between the chip and the substrate by selective solder bump deposition on both the chip and the substrate followed by a reflow to merge the sets of bumps. An underfill material is next placed between the mating surfaces of the semiconductor chip and the substrate. Semiconductor, substrate and solder joint materials typically have quite different coefficients of thermal expansion (CTE) and thus different thermal strain rates. The underfill material is designed to lessen the effects of the sometimes wide differences in CTE.

Solder joint fatigue is one of the key reliability issues related to flip-chip assembly on organic substrates. Solder joint fatigue is a function of several factors including: (1) large coefficient of CTE mismatch between a silicon die and the package substrate; (2) die size; (3) various geometrical factors related to the solder bumps, such as shape, size and height; (4) underfill and substrate material properties; and (5) the types of thermal cycling the joints must endure.

Die size is closely related to solder joint stress. The stresses on solder joints increase from a small value at the die center or neutral point to some higher value near the edges of the die. However, the outermost solder joints, those that are most distant from the die center or neutral point, are subjected to the maximum stresses. The stresses are highest for those joints located at the die corners.

One potential problem associated with high stresses at a die perimeter is the potential for the delamination of an underfill material layer from the die, particularly at the orthogonal corners. If the delamination occurs in critical areas or is sufficiently widespread, various unwanted mechanical effects may follow such as chip cracking, solder joint fatigue failure and so on.

One conventional technique for addressing the edge effect involves the use of sacrificial dummy bumps. As the name implies, dummy bumps are not connected to chip circuitry, but are instead set aside for reinforcement. Dummy bumps do help. But because they occupy sites that could otherwise be used for input/output, routing is constrained. If routing is to be maintained, then the die size must be increased with an attendant penalty in terms of material and processing cost.

Another conventional technique involves experimenting with underfill chemical compositions to try to prevent delamination. Chemical solutions to such problems may not be readily available.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a semiconductor chip with a first principal side. At least one rounded corner of the first principal side is formed.

In accordance with another aspect of an embodiment of the present invention, a method of manufacturing is provided that includes providing a semiconductor wafer that has plural semiconductor chips. Each of the plural semiconductor chips includes a first principal side and a second and opposite principal side. Material is removed from the semiconductor wafer to define at least one rounded corner of the first principal side of at least one of the plural semiconductor chips.

In accordance with another aspect of an embodiment of the present invention, an apparatus is provided that includes a semiconductor chip that has a first principal side. The first principal side includes at least one rounded corner.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various semiconductor chips with one or more rounded corners are disclosed. In one embodiment, a semiconductor chip is formed with opposing principal sides and such that corners of one of the principal sides are rounded. The rounding is done at the wafer or chip level and with a laser or other technique. Additional details will now be described.

Figure 1:
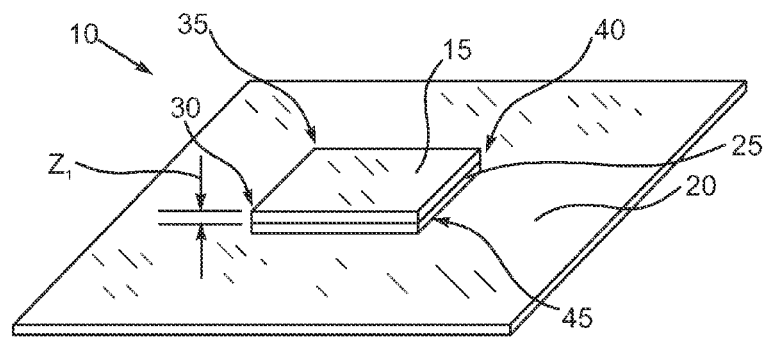
FIG. 1 is a pictorial view of a conventional semiconductor chip package that includes a semiconductor chip mounted on a package substrate.

In the drawings described below, reference numerals are generally repeated where identical elements appear in more than one figure. Turning now to the drawings, and in particular to FIG. 1 therein is shown a pictorial view of a conventional semiconductor chip package that includes a package 10 that includes a semiconductor chip 15 mounted on a package substrate 20. To lessen the effects of differential CTE between the semiconductor chip 15 and the package substrate 20, an underfill material layer 25 is dispersed between the semiconductor chip 15 and the package substrate 20. The semiconductor chip 15 is shown flip chip mounted to the package substrate 20 and is provided with a plurality of solder joints which are not visible in FIG. 1 but which electrically connect the chip 15 to the package substrate 20. Note that the conventional semiconductor chip 15 is singulated from some larger semiconductor work piece such as a wafer so as to form four substantially orthogonal or 90° corners 30, 35, 40 and 45. These corners 30, 35, 40 and 45 extend throughout the vertical height, $Z_1$, of the chip 15. Due to edge or corner effect the corners 30, 35, 40 and 45 of the semiconductor chip 15 constitute highly localized regions of stress concentration that can lead to delamination of the underfill material 25 from the semiconductor chip 15. If the delamination is expansive enough or in certain critical areas then a variety of mechanical defects can arise such as solder joint failure, die cracking and others.

Figure 2:
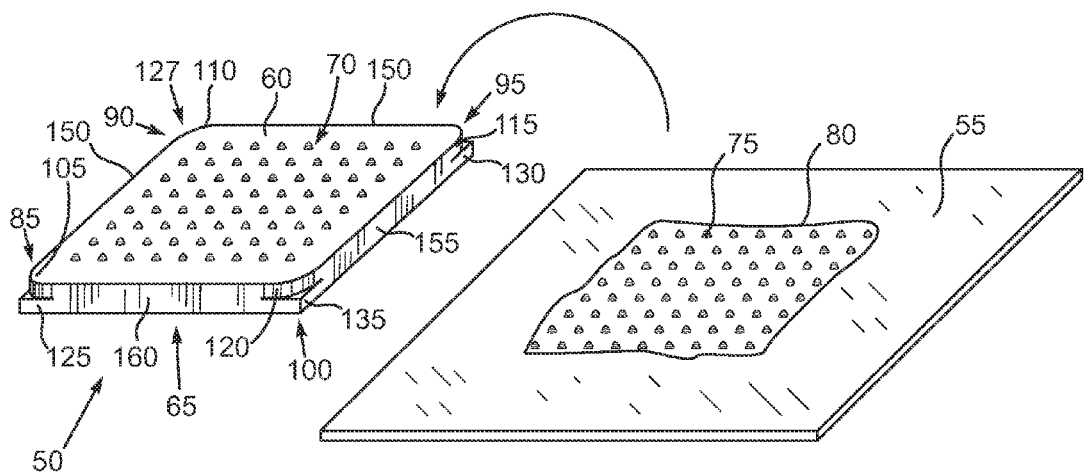
FIG. 2 is a pictorial view of an exemplary embodiment of a semiconductor chip that may be mounted to a circuit board.

FIG. 2 is a pictorial view of an exemplary embodiment of a semiconductor chip 50 that may be mounted to a circuit board 55. In FIG. 2, the semiconductor chip 50 is shown separated from the circuit board 55 and flipped over so that a principal side 60 of the semiconductor chip 50 is visible and an opposite principal side 65 thereof is not exposed. When mounted to the circuit board 55, side 60 of the semiconductor chip 50 faces toward the circuit board. The semiconductor chip 50 may be electrically connected to the circuit board 55 by way of plural solder joints that may be formed from the respective joining of plural solder bumps 70 of the chip 50 and plural solder bumps or structures 75 of the circuit board 55. However, it should be understood that other types of interconnect structures, such as conductive pillars alone or in conjunction with solder or other types of interconnect structures may be used to connect the chip 50 to the circuit board 55 electrically. When the side 60 of the chip 50 is mounted to the circuit board 55, an underfill material layer 80 is placed in the space between the side 60 and the circuit board 55 to lessen the effects of differential CTE.

Unlike a conventional semiconductor die such as the semiconductor die 15 which has four 90° corners that extend from top to bottom of the chip, i.e., throughout the vertical dimensions $Z_1$, the semiconductor chip 50 has four corners 85, 90, 95 and 100 that include rounded portions 105, 110, 115 and 120 and angled portions 125, 127, 130 and 135, which in the exemplary embodiments are orthogonal portions. Note that the orthogonal portion 127 for the corner 90 is shown in phantom. A technical goal of providing the corners 85, 90, 95 and 100 with corresponding rounded portions 105, 110, 115 and 120 is to reduce the stress concentration associated with otherwise orthogonal corners proximate the side 60 that is exposed to the underfill material layer 80 depicted in FIG. 2 following mounting. In this illustrative embodiment, the rounded portions 105, 110, 115 and 120 blend into the edges 145, 150, 155 and 160 of the semiconductor chip 50.

It bears mention at this point that the rounding of at least portions of the corners 85, 90, 95 and 100 is no way tied to a particular semiconductor configuration. Indeed, the semiconductor chip 50 may be implemented as may be any of a myriad of different types of circuit devices used in electronics, such as, for example, microprocessors, graphics processors, combined microprocessor/graphics processors, application specific integrated circuits, memory devices or the like, and may be single or multi-core. The semiconductor chip 50 may be constructed of bulk semiconductor, such as silicon or germanium, or semiconductor-on-insulator materials, such as silicon-on-insulator materials. Similarly the optional circuit board 55 may be a semiconductor chip package substrate, a circuit card, or virtually any other type of printed circuit board. A monolithic, buildup or other structure could be used for the circuit board 55. In this regard, the circuit board 35 may consist of a central core upon which one or more build-up layers are formed and below which an additional one or more build-up layers are formed. The core itself may consist of a stack of one or more layers. If implemented as a semiconductor chip package substrate, the number of layers in the circuit board 55 can vary from four to sixteen or more, although less than four may be used. So-called "coreless" designs may be used as well. The layers of the circuit board 55 may consist of an insulating material, such as various well-known epoxies, interspersed with metal interconnects. A multi-layer configuration other than buildup could be used. Optionally, the circuit board 55 may be composed of well-known ceramics or other materials suitable for package substrates or other printed circuit boards. The circuit board 55 is provided with a number of conductor traces and vias and other structures (not visible) in order to provide power, ground and signals transfers between the semiconductor chip 50 and another device, such as another circuit board for example. The circuit board 55 may be electrically connected to another device (not shown) by way of an input/output array such as a ball grid array, pin grid array, land grid array or other.

Figure 3:
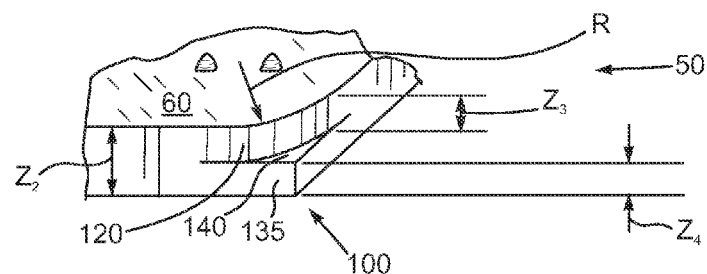
FIG. 3 is a pictorial view of a portion of FIG. 2 shown at greater magnification.

Additional details of the geometry of the corners 85, 90, 95 and 100 may be understood by referring now to FIG. 3, which is a pictorial view of the corner 100 shown at greater magnification. The discussion of the corner 100 will be illustrative of the other corners 85, 90 and 95. In this illustrative embodiment, the semiconductor chip 50 has some average thickness or height $Z_2$. The rounded portion 120 may have a thickness or height $Z_3$ and the orthogonal portion 135 may have a thickness $Z_4$. The thicknesses $Z_3$ and $Z_4$ may be equal or unequal as desired. Note also that the rounded portion 120 may be formed with a radius of curvature R that may take on a variety of values depending upon the size of the semiconductor chip 50 and the desired roundness of the rounded portion 120. The other corners 85, 90 and 95 of the semiconductor chip 50 depicted in FIG. 2 may be configured like the corner 100 or differently, that is with different radii of curvature and different rounded portion thicknesses. This usage of different corner geometries for a given semiconductor chip may be useful in circumstances where the semiconductor chip exhibits asymmetric thermal expansion at the various corners or asymmetric corner stress due to asymmetric die footprint. If it is anticipated that a given corner will exhibit greater stress concentration, then greater rounding or thickness of the rounded portion can be used there.

The fabrication of the rounded portion 120 with a dimension $Z_3$ that does not extend throughout the entirety of the thickness $Z_2$ of the chip 50 leaves a ledge 140. Additional details of the footprint of the semiconductor chip 50 may be understood by referring now to FIG. 4, which is a plan view. Here, the side 60 along with the corners 85, 90, 95 and 100 are shown. In this illustrative embodiment, the rounded portions 105, 110, 115 and 120 blend into the edges 145, 150, 155 and 160 of the semiconductor chip 50 so that only a very small ledge 140 is left for the corner 100 and correspondingly small ledges 165, 170 and 175 for the corners 85, 90 and 95. As described more below, the blending of rounded portions 105, 110, 115 and 120 to edges 145, 150, 155 and 160 may be achieved by performing a dicing operation so as to leave no extra lateral borders, save the ledges 140, 165, 170 and 175.

It should be understood that a semiconductor chip may be fabricated so that the rounded portions of the corners define a plateau that projects above a rectangular ridge or border that extends around the periphery of the chip. In this regard, attention is now turned to FIG. 5, which is a plan view like FIG. 4 but of an alternative exemplary embodiment of a semiconductor chip 50'. In this illustrative embodiment, the chip 50' includes corners 85', 90', 95' and 100' that have corresponding rounded portions 105', 110', 115' and 120' that define a plateau that projects above (as in out of the page from) a peripheral ledge or border 180 that terminates at four orthogonal corners 125', 127', 130' and 135'. The ledge 180 may be established by simply singulating the semiconductor chip 50 from a semiconductor work piece in such a way as to preserve more of the semiconductor wafer material to leave the ledge 180.

Figure 4:
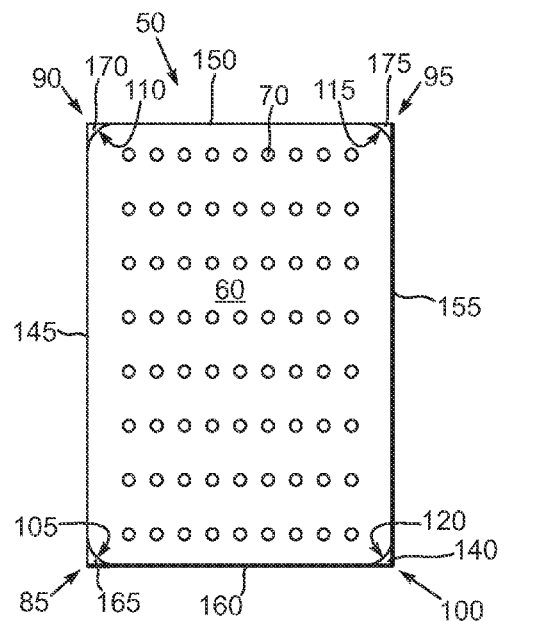
FIG. 4 is a plan view of the semiconductor chip depicted in FIG. 2.
Figure 5:
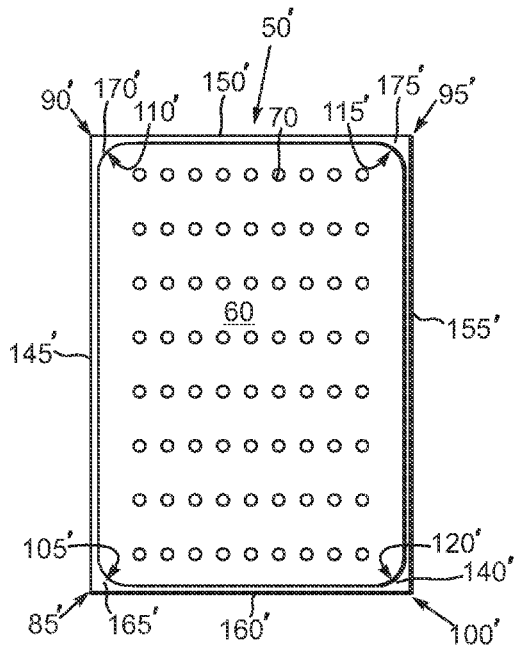
FIG. 5 is a plan view of an alternate exemplary embodiment of a semiconductor chip.
Figure 6:
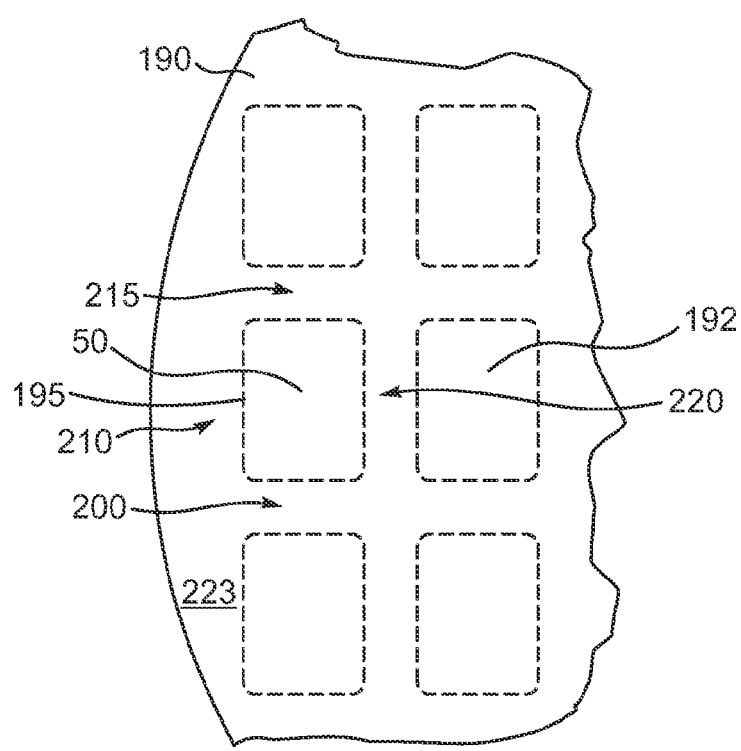
FIG. 6 is a plan view of a portion of a semiconductor wafer that includes the exemplary semiconductor chip.
Figure 7:
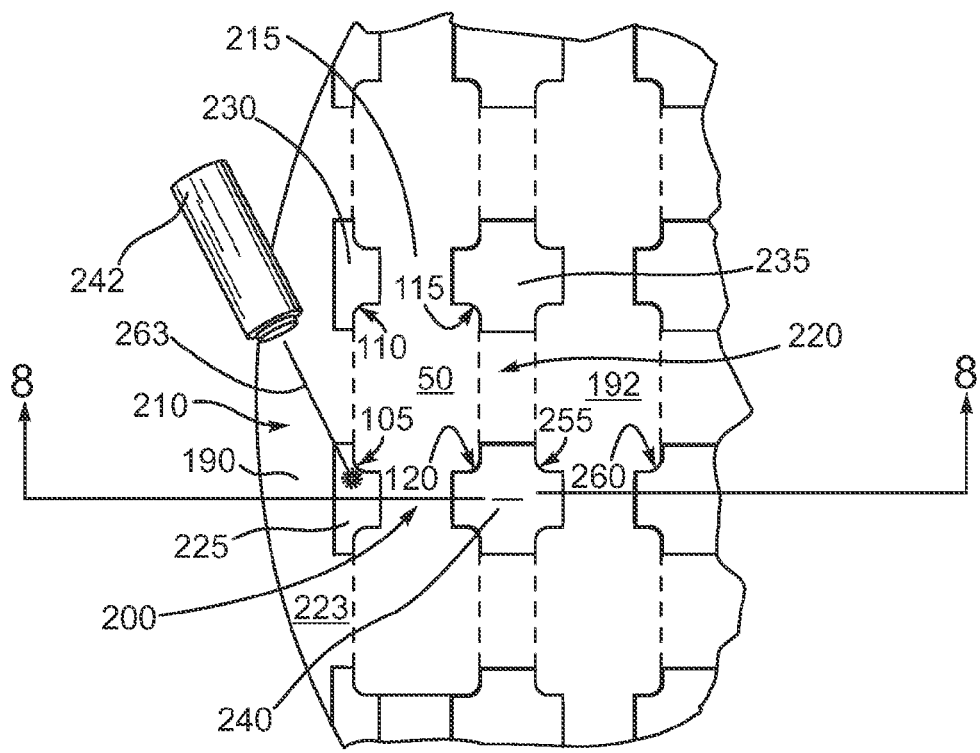
FIG. 7 is a plan view of the semiconductor wafer undergoing rounding of corners of the semiconductor chip.

An exemplary fabrication process for forming the semiconductor chip 50 may be understood by referring now to FIGS. 6 and 7 and initially to FIG. 6. FIG. 6 is a plan view of a small portion of a semiconductor wafer 190 that includes semiconductor chips or dice that are ready for singulation. One is the semiconductor chip 50 described elsewhere herein and another is labeled 192. The dashed boxes, such as the box 195 around the semiconductor chip 50, represent the desired footprints of the upper surfaces of the semiconductor chips 50 and 192 following singulation. Using the semiconductor chip 50 as an example and referring again also to FIG. 4, the dashed box 195 in FIG. 6 depicts the desired post-singulation footprint of the side 60 of the semiconductor chip 50. As shown in FIG. 4, the footprint includes the rounded portions 105, 110, 115 and 120 and the edges 145, 150, 155 and 160. The regions between the semiconductor chips 50 and 192 define dicing streets four of which are identified for the semiconductor chips 50 and 192 and labeled 200, 210, 215 and 220. If desired, a protective film 223 may be applied to the wafer 190 to inhibit the adherence of cutting debris during laser cutting operations that follow. A variety of materials may be used for the film 223. In an exemplary embodiment, a water soluble film of Hogomax supplied by DISCO Corporation of Tokyo, Japan may be used.

As shown in FIG. 7, openings, such as the openings 225, 230, 235 and 240, may be laser drilled around the various semiconductor chips 50 and 192 using a laser source 242. The openings 225, 230, 235 and 240 will be cut to define the rounded portions 105, 110, 115 and 120 of the semiconductor chip 50, rounded portions 255 and 260 of the semiconductor chip 192 (and others not labeled) and to a depth of $Z_3$ as viewed into and out of the page (see FIGS. 2 and 3). The shapes and number of the openings may be varied so long as the rounding of the corners is achieved. The power, wavelength and spot size of the laser radiation 263 may tailored as desired to achieve desirable material removal rates, cutting accuracy and wafer heating. In an exemplary process, the power may be about 4 to 8 W, the wavelength may be about 200 to 400 nm, and the spot size may be about 10 to 20 μm. The laser cutting may liberate quantities of debris in the form of particles and condensates that may settle on the semiconductor wafer 190. Accordingly, the aforementioned protective film 223 may be used and well-known cleansing processes should follow the cutting operations.

Figure 8:
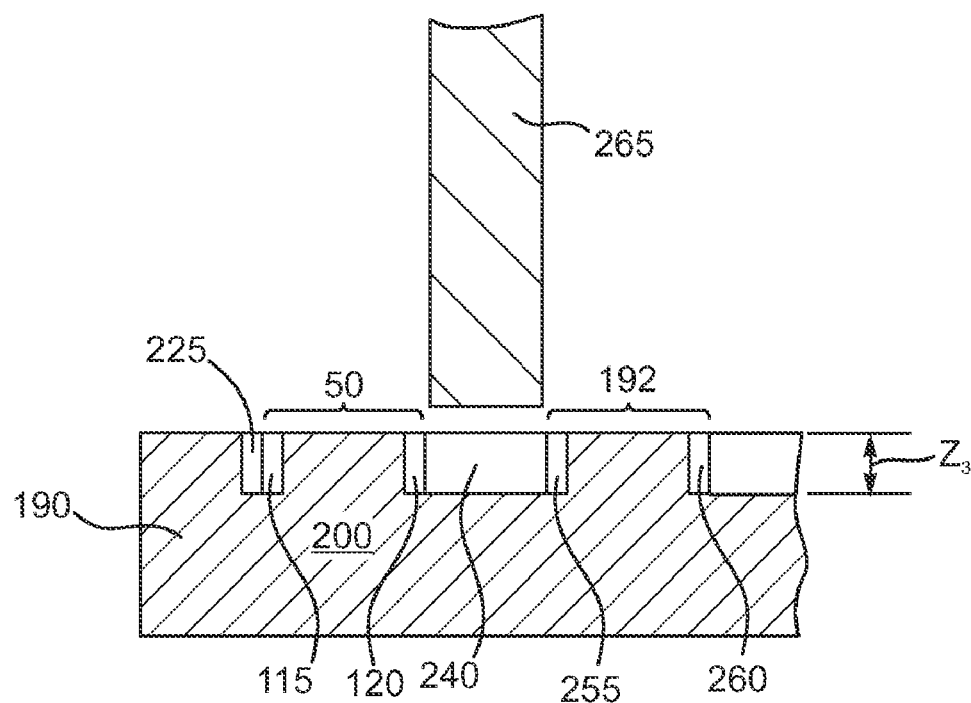
FIG. 8 is a sectional view of FIG. 7 taken at section 8-8.

Additional details of the portion of the semiconductor wafer 190 that includes the semiconductor chips 50 and 192 will be shown in section in FIG. 8. Before turning to FIG. 8, it should be noted that FIG. 8 is a sectional view of FIG. 7 taken at section 8-8, and that section 8-8 passes through the openings 225 and 240 as well as the dicing street 200. With that backdrop, attention is now turned to FIG. 8. The semiconductor chips 50 and 192 appear in section. However, the opening 225, the rounded portions 115 and 120, the opening 240 and rounded portions 255 and 260 of the semiconductor chip 250 do not appear in section. As noted above, the openings 225 and 240 may be cut to a depth $Z_3$. Thereafter, the semiconductor chips 50 and 192 may be singulated by way of a dicing operation using a saw blade 265 or perhaps another type of cutting device to yield singulated semiconductor chips 50 and 192 that have footprints typified by FIGS. 2, 3 and 4 described elsewhere herein.

Figure 9:
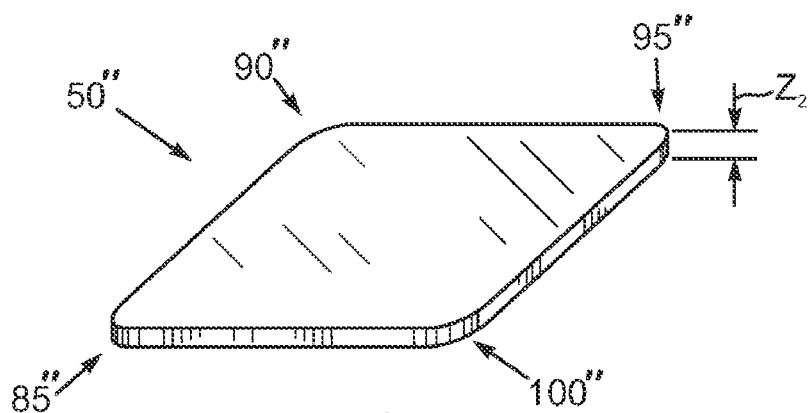
FIG. 9 is a pictorial view of an alternate exemplary semiconductor chip.

It should be understood that a semiconductor chip may be singulated from a work piece with rounded corners that extend through the full thickness of the chip. In this regard, attention is now turned to FIG. 9, which is a pictorial view of an exemplary embodiment of a semiconductor chip 50" that is post singulation. Here the semiconductor chip 50" includes rounded corners 85", 90", 95" and 100" that are rounded throughout the entire thickness $Z_2$ of the chip 50". The semiconductor chip 50" may be shaped using the same general techniques described above in conjunction with FIGS. 6 and 7 with a notable difference. The outlines of the chip 50" may be laser cut using the aforementioned techniques, however, the drilling process may be continued to cut through the entirety of a semiconductor wafer, i.e., through the entire thickness $Z_2$ of the semiconductor chip 50. Ultimate singulation may be performed as described elsewhere herein.

Figure 10:
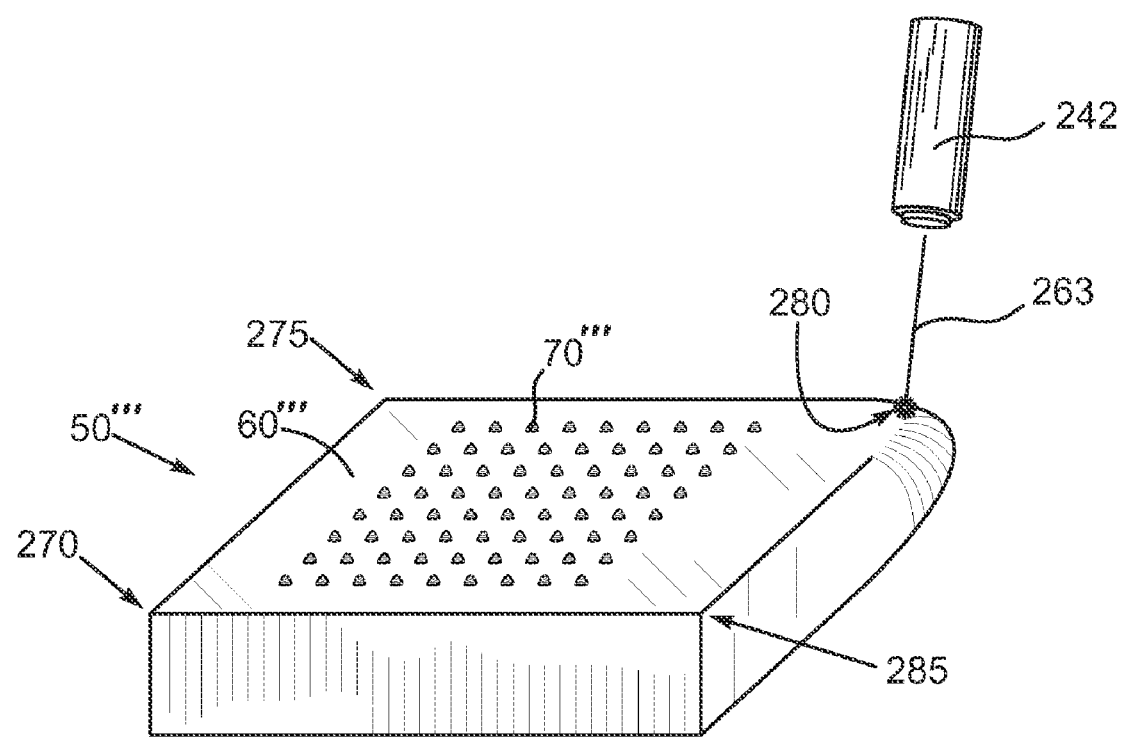
FIG. 10 is a pictorial view of another exemplary semiconductor chip.

In another alternate exemplary process, rounded chip corners may be obtained post-singulation. Attention is now turned to FIG. 10, which is a pictorial view of a semiconductor chip 50'''. Here, a surface 60''' of the chip 50''' is provided with plural solder bumps 70'''. Rounded corners particularly proximate the side 60''' may be provided post singulation by laser ablation. In this regard, the laser source 242 may be used to round the upper corners 270, 275, 280 and 285 of the chip 50'''. Initially, the semiconductor chip 50''' may be singulated from a semiconductor workpiece (not shown) by laser drilling, mechanical sawing, or combinations of the two or other techniques to yield the semiconductor chip 50''' with orthogonal corners 270, 275, 280 and 285. Thereafter the laser source 242 may be activated and to ablate the corners 270, 275, 280 and 285. Note that FIG. 10 depicts the formerly orthogonal corner 280 undergoing laser rounding. The energy and spot size of the beam 290 may be tailored according to the requirements of the chip 50''' as described elsewhere herein.

Any of the exemplary embodiments described herein may be configured with less than four corners and less than all corners rounded. For example, the embodiment depicted in FIGS. 2, 3 and 4 could be configured with at least one rounded portion 120. The same is true for the other embodiments.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a semiconductor chip with a first principal side, a second and opposite principal side, and at least two edge surfaces that intersect, the semiconductor chip being part of a semiconductor wafer; and
   forming at least one rounded corner at the intersection of the at least two edge surfaces by laser ablation and thereafter singulating the semiconductor chip from the semiconductor wafer by mechanical sawing, the at least one rounded corner extending from the first principal side toward but not to the second principal side to leave a ledge.

2. The method of claim 1, wherein the singulating the semiconductor chip forms a substantially orthogonal corner of the second principal side opposite to the at least one rounded corner.

3. The method of claim 1, comprising coupling a circuit board to the semiconductor chip.

4. A method of manufacturing, comprising:
providing a semiconductor wafer including plural semiconductor chips, each of the plural semiconductor chips including a first principal side and a second and opposite principal side and at least two edge surfaces that intersect;
removing material from the semiconductor wafer by laser ablation to define at least one rounded corner at the intersections of the at least two edge surfaces of at least one of the plural semiconductor chips, the at least one rounded corner extending from the first principal side toward but not to the second principal side to leave a ledge; and
singulating the at least one semiconductor chip from the semiconductor wafer by mechanical sawing.

5. The method of claim 4, comprising singulating the at least one semiconductor chip to form a substantially orthogonal corner of the second principal side opposite to the at least one rounded corner.

6. The method of claim 4, wherein at least one of the semiconductor chips includes four intersecting edge surfaces, the method comprising removing material from the semiconductor wafer to define four rounded corners of the intersections of the edge surfaces.

7. The method of claim 6, wherein the four rounded corners are set back to define a ledge extending about a periphery of the at least one semiconductor chip.

8. The method of claim 4, comprising coupling a circuit board to the semiconductor chip.

9. An apparatus, comprising:
a semiconductor chip including a first principal side, a second principal side and at least two edge surfaces that intersect;
at least one rounded corner at the intersection of the at least two edge surfaces, the at least one rounded corner extending from the first principal side toward but not to the second principal side to leave a ledge; and
a substantially orthogonal corner of the second principal side opposite to the at least one rounded corner.

10. The apparatus of claim 9, wherein the semiconductor chip includes four intersecting edge surfaces and a rounded corner at each intersection of the four edges surfaces.

11. The apparatus of claim 10, wherein the four rounded corners are set back to define a ledge extending about a periphery of the semiconductor chip.

12. The apparatus of claim 9, comprising a circuit board coupled to the semiconductor chip.

* * * * *